(12) United States Patent
Tao et al.

(10) Patent No.: US 7,326,521 B1
(45) Date of Patent: *Feb. 5, 2008

(54) METHOD OF IMAGING AND DEVELOPING NEGATIVE-WORKING ELEMENTS

(75) Inventors: Ting Tao, Fort Collins, CO (US);
Kevin B. Ray, Fort Collins, CO (US);
Scott A. Beckley, Windsor, CO (US);
Paul R. West, Fort Collins, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/513,995

(22) Filed: Aug. 31, 2006

(51) Int. Cl.
*G03F 7/029* (2006.01)
*G03F 7/32* (2006.01)
*G03F 7/14* (2006.01)

(52) U.S. Cl. ............... 430/302; 430/325; 430/331

(58) Field of Classification Search ............ 430/302, 430/325, 17, 331
See application file for complete search history.

(56) References Cited

U.S. PATENT DOCUMENTS

| | | | |
|---|---|---|---|
| 3,891,438 A * | 6/1975 | Katz et al. | 430/331 |
| 5,756,267 A * | 5/1998 | Matsuda et al. | 430/331 |
| 6,248,502 B1 | 6/2001 | Eklund | |
| 6,306,555 B1 * | 10/2001 | Schulz et al. | 430/270.1 |
| 6,365,330 B1 * | 4/2002 | Leichsenring et al. | 430/331 |
| 6,511,790 B2 | 1/2003 | Takamiya | |
| 6,649,668 B1 * | 11/2003 | David et al. | 522/15 |
| 6,803,167 B2 | 10/2004 | Patel et al. | |
| 6,844,141 B1 | 1/2005 | Patel et al. | |
| 6,902,865 B2 | 6/2005 | Teng | |
| 7,045,269 B2 | 5/2006 | Collins et al. | |
| 7,175,949 B1 * | 2/2007 | Tao et al. | 430/17 |
| 2002/0119404 A1 * | 8/2002 | Fiebag et al. | 430/331 |
| 2004/0185369 A1 | 9/2004 | Patel | |

OTHER PUBLICATIONS

U.S. Appl. No. 11/441,601, filed May 26, 2006, titled Negative-Working Radiation-Sensitive Compositions and Imageable Materials, by Tao et al.

U.S. Appl. No. 11/475,694, filed Jun. 27, 2006, titled Negative-Working Radiation-Sensitive Compositions and Imageable Elements by Munnelly et al.

U.S. Appl. No. 11/349,376 filed Feb. 7, 2006, titled Negative-Working Radiation-Sensitive Compositions and Imageable Materials by Tao et al.

U.S. Appl. No. 11/356,518 filed Feb. 17, 2006, titled Radiation-Sensitive Compositions and Imageable Materials by Tao et al.

* cited by examiner

*Primary Examiner*—Richard L. Schilling
(74) *Attorney, Agent, or Firm*—J. Lanny Tucker

(57) ABSTRACT

Negative-working imageable elements can be imaged and then developed using a lower pH organic-based single-phase developer that is less toxic and corrosive and that can be more readily disposed of after use. This developer has a pH less than 12 and comprises a) an amphoteric surfactant comprising a nitrogen-containing heterocycle, b) an amphoteric surfactant having two or more nitrogen atoms, or c) an amphoteric surfactant of a) and an amphoteric surfactant of b).

13 Claims, No Drawings

METHOD OF IMAGING AND DEVELOPING NEGATIVE-WORKING ELEMENTS

FIELD OF THE INVENTION

This invention relates to a method of imaging and developing negative-working imageable elements with environmentally friendly developers.

BACKGROUND OF THE INVENTION

Radiation-sensitive compositions are routinely used in the preparation of imageable materials including lithographic printing plate precursors. Such compositions generally include a radiation-sensitive component, a radically polymerizable component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Various negative-working radiation compositions and imageable elements containing reactive polymer binders are known in the art. Some of these compositions and elements are described for example in U.S. Pat. No. 6,569,603 (Furukawa), U.S. Pat. No. 6,309,792 (Hauck et al.), U.S. Pat. No. 6,582,882 (Pappas et al.), U.S. Pat. No. 6,893,797 (Munnelly et al.), U.S. Pat. No. 6,787,281 (Tao et al.), and U.S. Pat. No. 6,899,994 (Huang et al.), U.S. Patent Application Publication 2003/0118939 (West et al.), and EP 1,079,276A1 (Lifka et al.), EP 1,182,033A1 (Fujimaki et al.), and EP 1,449,650A1 (Goto).

Organic solvent-based based solvents including terpene esters are described for processing flexographic printing plates in U.S. Pat. No. 6,248,502 (Eklund).

Solvent-based alkaline developers have been used to provide images in positive-working imaged elements as described for example in U.S. Pat. Nos. 6,803,167 (Patel et al.) and 6,844,141 (Patel et al.), and in U.S. Patent Application Publication 2004/185369 (Patel). Solvent-based developers have also been used to process negative-working imaged elements as described in U.S. Pat. No. 7,045,269 (Collins et al.).

PROBLEM TO BE SOLVED

The various radiation sensitive compositions of the art can readily be used to prepare negative-working imageable elements. In the literature and in commercial embodiments, these imaged negative-working elements have been typically developed using high pH aqueous developers. Alternatively, UV-imaged negative-working elements have been developed using organic solvent-based developers that contain amines or other organic compounds that are objectionable from an environmental standpoint.

It would be desirable to process negative-working imageable elements with more environmentally friendly developers that are less toxic and corrosive.

SUMMARY OF THE INVENTION

The present invention provides a method of providing an imaged and developed element comprising:

A) using a laser, imagewise exposing a negative-working imageable element comprising a substrate having thereon an imageable layer to provide exposed and non-exposed regions, the imageable layer comprising:

a free radically polymerizable component, an initiator composition capable of generating radicals sufficient to initiate polymerization of the radically polymerizable component upon exposure to imaging radiation, a radiation absorbing compound, and a polymeric binder, and B) contacting the imagewise exposed element with a single-phase developer to remove only the non-exposed regions to provide a developed element, wherein the developer has a pH less than 12 and comprises:

a) an amphoteric surfactant comprising a nitrogen-containing heterocycle, b) an amphoteric surfactant having two or more nitrogen atoms, or c) an amphoteric surfactant of a) and an amphoteric surfactant of b).

The invention also provides imaged elements obtained from the method of this invention, such as lithographic printing plates.

We have found that with the use of the noted organic solvent-based developers, we have provided a more environmentally acceptable way to image and develop negative-working imageable elements that are sensitive to a wide range of imaging radiation, that is, from "violet" (for example, having a $\lambda_{max}$ of from about 250 to about 450 nm) to infrared radiation (for example, having a of from about 650 to about 1400 nm). Specifically, the developers include one or more organic solvents such as benzyl alcohol and preferably silicates, alkali metal hydroxides, and mono- and diethanolamines are excluded to reduce developer toxicity. Moreover, the developers have a relatively lower pH so they are less corrosive.

DETAILED DESCRIPTION OF THE INVENTION

Definitions

In addition, unless the context indicates otherwise, the various components described herein such as "radically polymerizable component", "radiation absorbing compound", "polymeric binder", "amphoteric surfactant", "benzene or naphthalene sulfonate surfactant", and similar terms also refer to mixtures of such components. Thus, the use of the articles "a", "an", and "the" are not necessarily meant to refer to only a single component.

Moreover, unless otherwise indicated, percentages refer to percents by dry weight.

The term "single-layer" means that there is a single imageable layer needed for imaging, but that does not preclude the presence of other layers under or over (topcoat) the imageable layer.

The term "radiation absorbing compound" refers to a compound or compounds that convert irradiation into thermal heat. They are also sometimes known as "sensitizers", "photothermal conversion materials", or "photothermal convertors".

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Radiation-sensitive Compositions

The radiation-sensitive compositions described herein may have any utility wherever there is a need for a coating that is polymerizable using suitable electromagnetic radiation, and particularly where it is desired to remove unexposed regions of the coated and imaged composition. The radiation-sensitive compositions can be used to prepare imageable elements for use as printed circuit boards for integrated circuits (printing circuit boards), paint compositions, molding compositions, color filters, chemically amplified resists, imprint lithography, microelectronic and microoptical devices, and photomask lithography, and preferably printed forms such as lithographic printing plate precursors and imaged printing plates that are defined in more detail below.

The free radically polymerizable component used in the radiation-sensitive composition consists of one or more compounds that have one or more ethylenically unsaturated polymerizable or crosslinkable groups that can be polymerized or crosslinked using free radical initiation. For example, the free radically polymerizable component can be ethylenically unsaturated monomers, oligomers, and polymers including crosslinkable polymers, or a combination of such compounds. Such free radically polymerizable components are not intended to include the cationically or acid-catalytically polymerizable or crosslinkable compounds described, for example in U.S. Pat. No. 6,306,555 (Schulz et al.) such as the cyclic ethers (including non-acrylate-containing epoxides), vinyl ethers, hydroxy compounds, lactones, cyclic thioethers, and vinyl thioethers.

Thus, suitable ethylenically unsaturated compounds that can be polymerized or crosslinked include ethylenically unsaturated polymerizable monomers that have one or more of the polymerizable groups, including unsaturated esters of alcohols, such as (meth)acrylate esters of polyols. Oligomers and/or prepolymers, such as urethane (meth)acrylates, epoxide (meth)acrylates, polyester (meth)acrylates, polyether (meth)acrylates, free-radical crosslinkable polymers, and unsaturated polyester resins can also be used.

Particularly useful radically polymerizable components include free-radical polymerizable monomers or oligomers that comprise addition polymerizable ethylenically unsaturated groups including multiple acrylate and methacrylate groups and combinations thereof, or free-radical crosslinkable polymers. More particularly useful radically polymerizable compounds include those derived from urea urethane (meth)acrylates or urethane (meth)acrylates having multiple polymerizable groups. For example, a most preferred radically polymerizable component can be prepared by reacting DESMODUR® N100 aliphatic polyisocyanate resin based on hexamethylene diisocyanate (Bayer Corp., Milford, Colo.) with hydroxyethyl acrylate and pentaerythritol triacrylate. Other preferred radically polymerizable compounds are available from Sartomer Company, Inc. such as SR399 (dipentaerythritol pentaacrylate), SR355 (di-trimethylolpropane tetraacrylate), SR295 (pentaerythritol tetraacrylate), and others that would be readily apparent to one skilled in the art.

Also useful are urea urethane (meth)acrylates and urethane (meth)acrylates described in U.S. Pat. Nos. 6,582,882 (noted above) and 6,899,994 (noted above). Alternatively, a poly(urea urethane)acrylate or poly(urethane)-acrylate can be prepared from the reaction of a diisocyanate with a diol having free carboxy groups similarly to the preparation of allyl functional polyurethanes described in U.S. Pat. No. 5,919,600 (Huang et al.).

Numerous other radically polymerizable compounds are known to those skilled in the art and are described in considerable literature including *Photoreactive Polymers The Science and Technology of Resists*, A Reiser, Wiley, New York, 1989, pp. 102-177, by B. M. Monroe in *Radiation Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, N.Y., 1989, pp. 226-262.

The radically polymerizable component is present in the radiation-sensitive composition in an amount sufficient to render the composition insoluble in a developer after exposure to radiation. This is generally from about 10 to about 70 weight % and preferably from about 20 to about 50 weight % based on the dry weight of the radiation-sensitive composition. For example, the weight ratio of radically polymerizable component to the polymeric binder (described below) is generally from about 5:95 to about 95:5, preferably from about 10:90 to about 90:10, and more preferably from about 30:70 to about 70:30.

The radiation-sensitive composition also includes an initiator composition that is capable of generating free radicals sufficient to initiate polymerization of the free radically polymerizable component upon exposure of the composition to imaging radiation. The initiator composition may be responsive, for example, to electromagnetic imaging radiation in the ultraviolet, visible and/or infrared spectral regions, corresponding to the spectral range of at least 250 nm and up to and including 1500 nm. UV or "violet" sensitivity is generally at least 250 nm and up to and including 450 nm and in some embodiments, the radiation-sensitive composition is sensitive to imaging or exposing radiation of at least 375 nm and up to and including 450 nm and includes an appropriate initiator composition for that imaging region. In other embodiments, the initiator composition is responsive to imaging or exposing infrared or near infrared radiation range of at least 650 nm and up to and including 1500 nm, and more preferably to imaging infrared radiation of at least 700 nm and up to and including 1200 nm and initiator compositions are used that are appropriate to that imaging range.

In general, suitable initiator compositions comprise compounds that include but are not limited to, amines (such as alkanol amines), thiol compounds, anilinodiacetic acids or derivatives thereof, N-phenyl glycine and derivatives thereof, N,N-dialkylaminobenzoic acid esters, N-arylglycines and derivatives thereof (such as N-phenylglycine), aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, alkyltriarylborates, trihalogenomethylarylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), borate and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts). Other known initiator composition components are described for example in U.S. Patent Application Publication 2003/0064318 (noted above).

Particularly useful initiator composition components for UV or "violet" light sensitive radiation-sensitive compositions include hexaarylbiimidazoles (also known as triarylimidazolyl dimers) such as, for example, 2,2'-bis(2-chlorophenyl)-4,4',5,5'-tetraphenyl-biimidazole and 2,2'-bis(o-chlorophenyl-4,4',5,5'-tetra(m-methoxyphenyl) biimidazole. The triazines noted below can be used with exposure to imaging radiation at about any wavelength including UV and "violet" radiation exposure.

Other UV or "violet" radiation-sensitive free-radical generating compounds include but are not limited to, trichloromethyl triazines as described, for example, in U.S. Pat. No. 4,997,745 (Kawamura et al.) and diaryliodonium salts.

Co-initiators can also be used, such as metallocenes (such as titanocenes and ferrocenes), polycarboxylic acids, haloalkyl triazines, thiols or mercaptans (such as mercaptotriazoles), borate salts, and photooxidants containing a heterocyclic nitrogen that is substituted by an alkoxy or acyloxy group, as described in U.S. Pat. No. 5,942,372 (West et al.).

For IR-sensitive radiation-sensitive compositions, the preferred initiator compositions comprise an onium salt including but not limited to, a sulfonium, oxysulfoxonium, oxysulfonium, sulfoxonium, ammonium, selenonium, arsonium, phosphonium, diazonium, or halonium salt. Further details of useful onium salts, including representative examples, are provided in U.S. Patent Application Publication 2002/0068241 (Oohashi et al.), WO 2004/101280 (Munnelly et al.), and U.S. Pat. Nos. 5,086,086 (Brownsley et al.), 5,965,319 (Kobayashi), and 6,051,366 (Baumann et al.). For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is —N≡N$^+$). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents. The onium salts generally include a suitable number of negatively-charged counterions such as halides, hexafluorophosphate, thiosulfate, hexafluoroantimonate, tetrafluoroborate, sulfonates, hydroxide, perchlorate, n-butyltriphenyl borate, tetraphenyl borate, and others readily apparent to one skilled in the art.

The halonium salts are more preferred, and the iodonium salts are most preferred. In one preferred embodiment, the onium salt has a positively-charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

Particularly useful boron components include organic boron salts that include an organic boron anion such as those described in the noted U.S. Pat. No. 6,569,603 that is paired with a suitable cation such as an alkali metal ion, an onium, or a cationic sensitizing dye. Useful onium cations include but are not limited to, ammonium, sulfonium, phosphonium, iodonium, and diazonium cations. They may be used alone or in combination with various co-initiators such as heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) that is incorporated herein by reference in amounts of at least 0.5 and up to and including 10 weight % based on the total solids of the radiation-sensitive composition. The mercaptotriazoles are preferred in these combinations of compounds.

Other useful initiator compositions include one or more azine compounds as described for example in U.S. Pat. No. 6,936,384 (Munnelly et al.) that is incorporated herein by reference. These compounds are organic heterocyclic compounds containing a 6-membered ring formed from carbon and nitrogen atoms. Azine compounds include heterocyclic groups such as pyridine, diazine, and triazine groups, as well as polycyclic compounds having a pyridine, diazine, or triazine substituent fused to one or more aromatic rings such as carbocyclic aromatic rings. Thus, the azine compounds include, for example, compounds having a quinoline, isoquinoline, benzodiazine, or naphthodiazine substituent. Both monocyclic and polycyclic azine compounds are useful.

Especially useful azine compounds are triazine compounds that include a 6-membered ring containing 3 carbon atoms and 3 nitrogen atoms such as those described in U.S. Pat. Nos. 6,309,792 (Hauck et al.), 6,010,824 (Komano et al.), 5,885,746 (Iwai et al), 5,496,903 (Watanabe et al.), and 5,219,709 (Nagasaka et al.).

The azinium form of azine compounds can also be used if desired. In azinium compounds, a quaternizing substituent of a nitrogen atom in the azine ring is capable of being released as a free radical. The alkoxy substituent that quaternizes a ring nitrogen atom of the azinium nucleus can be selected from among a variety of alkoxy substituents.

Halomethyl-substituted triazines, such as trihalomethyl triazines, are particularly useful in the initiator composition. Representative compounds of this type include but are not limited to, 1,3,5-triazine derivatives such as those having 1 to 3 —CX$_3$ groups wherein X independently represent chlorine or bromine atoms, including polyhalomethyl-substituted triazines and other triazines, such as 2,4-trichloromethyl-6-methoxyphenyl triazine, 2-phenyl-4,6-bis(trichloromethyl)-s-triazine, 2,4,6-tris(trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis(trichloromethyl)-s-triazine, 2-(4-ethoxynaphtho-1-yl)-4,6-bis(trichloromethyl)-s-triazine, and 2-(4-(2-ethoxyethyl)-naphtho-1-yl)-4,6-bis(trichloromethyl)-s-triazine, 2-(4-methylthiophenyl)-4,6-bis(trichloromethyl)-2-triazine, 2-(4-chlorophenyl-4,6-bis(trichloromethyl)-2-triazine, 2,4,6-tri(trichloromethyl)-2-triazine, and 2,4,6-tri(tribromomethyl)-2-triazine.

The azine compounds and particularly the triazine compounds may be used alone or in combination with one or more co-initiators such as titanocenes, mono- and polycarboxylic acids, hexaarylbisimidazoles, as described for example in U.S. Pat. No. 4,997,745 (Kawamura et al.).

In some embodiments, the radiation-sensitive composition also includes a mercaptan derivative such as a mercaptotriazole such as 3-mercapto-1,2,4-triazole, 4-methyl-3-mercapto-1,2,4-triazole, 5-mercapto-1-phenyl-1,2,4-triazole, 4-amino-3-mercapto-1,2,4-triazole, 3-mercapto-1,5-diphenyl-1,2,4-triazole, and 5-(p-aminophenyl)-3-mercapto-1,2,4-triazole. Various mercaptobenzimidazoles, mercaptobenzothiazoles, and mercaptobenzoxazoles may also be present.

Thus, several initiator/co-initiator combinations can be used in various embodiments of the present invention, namely:

a) a triazine as described above in combination with a co-initiator that is an N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof) as described above, b) a triazine as described above in combination with a co-initiator that is a mercaptan derivative as described above, c) an iodonium salt (such as an iodonium borate) as described herein in combination with a co-initiator that is a metallocene (for example a titanocene or ferrocene) as described for example in U.S. Pat. No. 6,936,384 (noted above), and d) an iodonium salt (such as an iodonium borate) as described herein in combination with a co-initiator that is a mercaptotriazole as described above.

Particularly useful initiator compositions include an iodonium borate that is capable of generating radicals sufficient to initiate polymerization of the radically polymerizable component upon exposure of the composition to imaging radiation. The iodonium borate initiator composition may be responsive, for example, to electromagnetic radiation in the "violet", visible and/or infrared spectral regions, corresponding to the broad spectral range of from about 250 nm to about 1500 nm. Preferably, the iodonium borate initiator composition is responsive to infrared or near infrared radiation in the range of from about 700 to about 1400 nm, and more preferably to infrared radiation in the range of from about 750 to about 1250 nm.

The iodonium borate initiator compositions comprise one or more diaryliodonium borate compounds, each of which is represented by the following Structure (I):

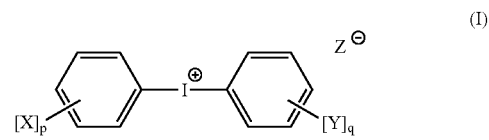

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, iso-propyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, iso-propoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). Preferably, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated by this invention but the "symmetric" compounds are preferred (that is, they have the same groups on both phenyl rings).

In addition, two or more adjacent X or Y groups can be combined to form a fused carbocyclic or heterocyclic ring with the respective phenyl groups.

The X and Y groups can be in any position on the phenyl rings but preferably they are at the 2- or 4-positions, and more preferably at the 4-position, on either or both phenyl rings.

Despite what type of X and Y groups are present in the iodonium cation, the sum of the carbon atoms in the X and Y substituents is at least 6, and preferably at least 8, and up to 40 carbon atoms. Thus, in some compounds, one or more X groups can comprise at least 6 carbon atoms, and Y does not exist (q is 0). Alternatively, one or more Y groups can comprise at least 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is at least 6. Still again, there may be a total of at least 6 carbon atoms on both phenyl rings.

In Structure I, p and q are independently 0 or integers of 1 to 5, provided that either p or q is at least 1. Preferably, both p and q are at least 1, and more preferably, each of p and q is 1. Thus, it is understood that the carbon atoms in the phenyl rings that are not substituted by X or Y groups have a hydrogen atom at those ring positions.

$Z^-$ is an organic anion represented by the following Structure (II):

(II)

wherein $R_1$, $R_2$, $R_3$, and $R_4$ are independently substituted or unsubstituted alkyl groups having 1 to 12 carbon atoms (such as methyl, ethyl, n-propyl, iso-propyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazoylyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms.

Preferably, $R_1$, $R_2$, $R_3$, and $R_4$ are independently substituted or unsubstituted alkyl or aryl groups as defined above, and more preferably, at least 3 of $R_1$, $R_2$, $R_3$, and $R_4$ are the same or different substituted or unsubstituted aryl groups (such as substituted or unsubstituted phenyl groups). Most preferably, all of $R_1$, $R_2$, $R_3$, and $R_4$ are the same or different substituted or unsubstituted aryl groups and most preferably, all of the groups are the same substituted or unsubstituted phenyl group. Most preferably, $Z^-$ is a tetraphenyl borate wherein the phenyl groups are substituted or unsubstituted (and preferably all are unsubstituted).

Representative iodonium borate compounds include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]-borate, 4-methoxyphenyl-4'-cyclohexylphenyliodonium tetrakis(penta-fluorophenyl)borate, 4-methylphenyl-4'-dodecylphenyliodonium tetrakis(4-fluorophenyl)borate, bis(dodecylphenyl)iodonium tetrakis(pentafluorophenyl)-borate, and bis(4-t-butylphenyl)iodonium tetrakis(1-imidazolyl)borate. Preferred compounds include bis(4-t-butylphenyl)iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the iodonium borate initiator composition.

The diaryliodonium borate compounds can be prepared, in general, by reacting an aryl iodide with a substituted or unsubstituted arene, followed by an ion exchange with a borate anion. Details of various preparatory methods are described in U.S. Pat. No. 6,306,555 (Schulz et al.), and references cited therein, and by Crivello, *J. Polymer Sci., Part A: Polymer Chemistry*, 37, 4241-4254 (1999).

The iodonium borate initiator composition including one or more diaryliodonium borate compounds is generally present in the radiation-sensitive composition in an amount of at least 1% and up to 30%, based on the total solids of the radiation-sensitive composition or the dry weight of the coated imageable layer. Preferably, the composition is present in an amount of from about 2% to about 15 weight %. One or more diaryliodonium borate compounds generally comprise from about 10 to 100% of the diaryliodonium borate initiator composition. In the coated imageable layers of the imageable elements, the diaryliodonium borate compound is generally present in an amount of at least 0.01 g/m² and preferably at from about 0.03 to about 0.3 g/m².

The free radical generating compounds in the other initiator compositions are generally present in the radiation-sensitive composition in an amount of at least 0.5% and up to and including 30%, and preferably at least 1 and up to and including about 15%, based on composition total solids or total dry weight of the imageable layer. The optimum amount of the various sensitizers may differ for various compounds and the sensitivity of the radiation-sensitive composition that is desired and would be readily apparent to one skilled in the art.

Any of a variety of polymeric binders can be used in the radiation-sensitive composition, including those known in the art for use in negative-working radiation-sensitive compositions. The polymeric binders generally have a molecular weight of from about 2,000 to about 1,000,000 and preferably from about 10,000 to about 200,000. The acid value (mg KOH/g) of the polymeric binder is generally from about 20 to about 400 as determined using known methods. In general, the polymeric binders used in this invention, particularly for IR-sensitive imageable elements, are soluble in aqueous solutions (including the organic solvent-containing developers described below) having a pH greater than 9 and preferably greater than 10. For example, the polymeric binders used in this invention are soluble in a developer having a pH of about 9.3 but the polymeric binder described for use in U.S. Pat. No. 6,902,865 (Teng) are not soluble in such a developer.

Some binders are water-insoluble but soluble in conventional alkaline developers. Examples of such polymeric binders include but are not limited to, polymers derived from (meth)acrylic acids and acid esters, polyvinyl acetals, phenolic resin, polymers derived from styrene and derivatives thereof, (meth)acrylonitriles, N-substituted cyclic imides or maleic anhydrides, such as those described in EP 1,182,033 (noted above) and U.S. Pat. Nos. 6,309,792 (noted above), 6,352,812 (Shimazu et al.), 6,569,603 (noted above), and 6,893,797 (noted above). Also useful are vinyl carbazole polymers having pendant N-carbazole moieties including those described in U.S. Pat. No. 4,774,163 (Higashi) and polymers having pendant vinyl groups including those described in U.S. Pat. Nos. 6,899,994 (Huang et al.) and 4,511,645 (Koike et al.), and EP 1,182,033A1 (Fujimaki et al.).

Other useful polymeric binders have hydrophobic backbones and comprise both of the following a) and b) recurring units, or the b) recurring units alone:

a) recurring units having pendant cyano groups attached directly to the hydrophobic backbone, and b) recurring units having pendant groups comprising poly(alkylene oxide) segments.

These polymeric binders comprise poly(alkylene oxide) segments and preferably poly(ethylene oxide) segments. These polymers can be graft copolymers having a main chain polymer and poly(alkylene oxide) pendant side chains or segments of block copolymers having blocks of (alkylene oxide)-containing recurring units and non(alkylene oxide)-containing recurring units. Both graft and block copolymers can additionally have pendant cyano groups attached directly to the hydrophobic backbone. The alkylene oxide constitutional units are generally $C_1$ to $C_6$ alkylene oxide groups, and more typically $C_1$ to $C_3$ alkylene oxide groups. The alkylene portions can be linear or branched or substituted versions thereof. Poly(ethylene oxide) and poly(propylene oxide) segments are preferred and poly(ethylene oxide) segments are most preferred.

In some embodiments, the polymeric binders contain only recurring units comprising poly(alkylene oxide) segments, but in other embodiments, the polymeric binders comprise recurring units comprising the poly(alkylene oxide) segments as well as recurring units having pendant cyano groups attached directly to the hydrophobic backbone. By way of example only, such recurring units can comprise pendant groups comprising cyano, cyano-substituted alkylene groups, or cyano-terminated alkylene groups. Recurring units can also be derived from ethylenically unsaturated polymerizable monomers such as acrylonitrile, methacrylonitrile, methyl cyanoacrylate, ethyl cyanoacrylate, or a combination thereof. However, cyano groups can be introduced into the polymer by other conventional means. Examples of such cyano-containing polymeric binders are described for example in U.S. Patent Application Publication 2005/003285 (Hayashi et al.).

By way of example, such polymeric binders can be formed by polymerization of a combination or mixture of suitable ethylenically unsaturated polymerizable monomers or macromers, such as:

A) acrylonitrile, methacrylonitrile, or a combination thereof,

B) poly(alkylene oxide) esters of acrylic acid or methacrylic acid, such as poly(ethylene glycol) methyl ether acrylate, poly(ethylene glycol) methyl ester methacrylate, or any combination thereof, and C) optionally, monomers such as acrylic acid, methacrylic acid, styrene, hydroxystyrene, acrylate esters, methacrylate esters, acrylamide, methacrylamide, or any combination of such monomers.

The amount of the poly(alkylene oxide) segments in such polymeric binders is from about 0.5 to about 60 weight %, preferably from about 2 to about 50 weight %, more preferably from about 5 to about 40 weight %, and most preferably from 5 to 20 weight %. The amount of (alkylene oxide) segments in the block copolymers is generally from about 5 to about 60 weight %, preferably from about 10 to about 50 weight %, and more preferably from about 10 to about 30 weight %. It is also possible that the polymeric binders having poly(alkylene oxide) side chains are present in the form of discrete particles.

Some preferred polymeric binders comprise recurring units derived from one or more of (meth)acrylic acids, (meth)acrylates, styrene and styrene derivatives, vinyl carbazoles, and poly(alkylene glycol) (meth)acrylates. More preferably, the polymeric binders comprise recurring units from two or more of such monomers.

The polymeric binders described above are generally present in an amount of from about 10 to about 70%, and preferably from about 20 to about 50%, based on the total solids content of the radiation-sensitive composition, or the dry weight of the imageable layer prepared therefrom.

In some embodiments, it may be useful to include a "secondary" binder in combination with the polymeric binders described above. Such secondary polymeric binders include acrylic-urethane hybrid polymers that are commercially available in dispersions from Air Products and Chemicals, Inc. (Allentown, Pa.) under the tradename Hybridur, for example, the Hybridur 540, 560, 570, 580, 870, and 878 acrylic-urethane hybrid dispersions. The secondary polymeric binder may be present in the radiation-sensitive composition in an amount of from about 5 to about 40 weight % based on the total solids content of the composition, or the dry coated weight of the imageable layer.

The radiation-sensitive composition generally includes one or more radiation absorbing compounds, or sensitizers, that absorb imaging radiation, or sensitize the composition to imaging radiation having a $\lambda_{max}$ of from the UV to the IR region of the electromagnetic spectrum, that is, at least 250 nm and up to and including 1500 nm. Some sensitizers can be used at any wavelength, but most sensitizers are optimally useful within certain wavelength ranges. For example, some sensitizers are optimal for use at an exposing wavelength of at least 250 nm and up to and including 450 nm while other are optimal for use at an exposure wavelength of at least 650 nm and up to and including 1500 nm (near IR and IR).

In some preferred embodiments, the radiation-sensitive composition contains a UV sensitizer where the free-radical generating compound is UV radiation sensitive (that is at least 250 nm and up to and including 450 nm), thereby facilitating photopolymerization. Typical UV radiation-sensitive free-radical generating compounds are described above. In some preferred embodiments, the radiation sensitive compositions are sensitized to "violet" radiation in the range of at least 375 nm and up to and including 450 nm. Useful sensitizers for such compositions include certain pyrilium and thiopyrilium dyes and 3-ketocoumarins (particularly in combination with a polycarboxylic acid free radical generating compound, such as anilino-N,N-diacetic acid).

Sensitizers that absorb in the visible region of the electromagnetic spectrum (that is at least 400 nm and up to and including 650 nm) can also be used. Examples of such sensitizers are well known in the art and include the compounds described in Cols. 17-22 of U.S. Pat. No. 6,569,603 (noted above). Other useful visible and UV-sensitive sensitizing compositions include a cyanine dye, diaryliodonium salt, and a co-initiator (as described above) as described in U.S. Pat. No. 5,368,990 (Kawabata et al.).

Other useful sensitizers for the violet/visible region of sensitization are the 2,4,5-triaryloxazole derivatives as described in WO 2004/074930 (Baumann et al.). These compounds can be used alone or with a co-initiator as described above, and especially with the 1,3,5-triazines described above or with thiol compounds. Useful 2,4,5-triaryloxazole derivatives can be represented by the Structure G-(Ar$_1$)$_3$ wherein Ar$_1$ is the same or different, substituted or unsubstituted carbocyclic aryl group having 6 to 12 carbon atoms in the ring, and G is a furan, oxazole, or oxadiazole ring. The Ar$_1$ groups can be substituted with one or more halo, substituted or unsubstituted alkyl, substituted or unsubstituted cycloalkyl, substituted or unsubstituted aryl, amino (primary, secondary, or tertiary), or substituted or unsubstituted alkoxy or aryloxy groups. Thus, the aryl groups can be substituted with one or more R'$_1$ through R'$_3$ groups, respectively, that are independently hydrogen or a substituted or unsubstituted alkyl group having from 1 to 20 carbon atoms (such as methyl, ethyl, iso-propyl, n-hexyl, benzyl, and methoxymethyl groups) substituted or unsubstituted carbocyclic aryl group having 6 to 10 carbon atoms in the ring (such as phenyl, naphthyl, 4-methoxyphenyl, and 3-methylphenyl groups), substituted or unsubstituted cycloalkyl group having 5 to 10 carbon atoms in the ring, a —N(R'$_4$)(R'$_5$) group, or a —OR'$_6$ group wherein R'$_4$ through R'$_6$ independently represent substituted or unsubstituted alkyl or aryl groups as defined above. Preferably, at least one of R'$_1$, through R'$_1$ is an —N(R'$_4$)(R'$_5$) group wherein R'$_4$ and R'$_5$ are the same or different alkyl groups. Preferred substituents for each Ar$_1$ group include the same or different primary, secondary, and tertiary amines and more preferably they are the same dialkylamines.

Still another class of useful violet/visible radiation sensitizers includes compounds represented by the Structure Ar$_1$-G-Ar$_2$ wherein Ar$_1$ and Ar$_2$ are the same or different substituted or unsubstituted aryl groups having 6 to 12 carbon atoms in the ring, or Ar$_2$ can be an arylene-G-Ar$_1$ or arylene-G-Ar$_2$ group, and G is a furan, ozazole, or oxadiazole ring. Ar$_1$ is the same as defined above, and Ar$_2$ can be the same or different aryl group as Ar$_1$. "Arylene" can be any of the aryl groups defined for Ar$_1$ but with a hydrogen atom removed to render them divalent in nature.

Additional useful "violet"—visible radiation sensitizers are the compounds described in WO 2004/074929 (Baumann et al.). These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted publication.

Preferably, the radiation absorbing compounds are sensitive to infrared and near-infrared radiation, that is, from about 600 to about 1400 nm and preferably from about 700 to about 1200 nm. Such radiation absorbing compounds include carbon blacks and other IR-absorbing pigments and various IR-sensitive dyes ("IR dyes"), which are preferred.

Examples of suitable IR dyes include but are not limited to, azo dyes, squarilium dyes, croconate dyes, triarylamine dyes, thiazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. Nos. 5,208,135 (Patel et al.), 6,569,603 (noted above), and 6,787,281 (noted above). A general description of one class of suitable cyanine dyes is shown by the formula in paragraph [0026] of WO 2004/101280.

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. Nos. 6,309,792 (Hauck et al.), 6,264,920 (Achilefu et al.), 6,153,356 (Urano et al.), and 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (DeBoer).

Useful IR absorbing compounds include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

The radiation absorbing compound can be present in the radiation-sensitive composition in an amount generally of at least 0.1% and up to 20% and preferably from about 0.5 to about 10%, based on total solids in the composition, that also corresponds to the total dry weight of the imageable layer. Alternatively, the amount can be defined by an absorbance in the range of from about 0.05 to about 3, and preferably from about 0.1 to about 1.5, in the dry film as measured by reflectance UV-visible spectrophotometry. The particular amount needed for this purpose would be readily apparent to one skilled in the art, depending upon the specific compound used.

The radiation-sensitive composition can also include a "primary additive" that is a poly(alkylene glycol) or an ether or ester thereof that has a molecular weight of from about 200 and up to 4000 (preferably from about 500 to about 2000). This primary additive is present in an amount of from about 2 to about 50 weight % (preferably from about 5 to about 30%) based on the total solids content of the composition, or the total dry weight of the imageable layer.

Particularly useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are SR9036 (ethoxylated (30) bisphenol A dimethacrylate), CD9038 (ethoxylated (30) bisphenol A diacrylate), and SR494 (ethoxylated (5) pentaerythritol tetraacrylate), and similar compounds all of which that can be obtained from Sartomer Company, Inc. In some embodiments, the primary additive may be "non-reactive" meaning that it does not contain polymerizable vinyl groups.

The radiation-sensitive composition can also include a "secondary additive" that is a poly(vinyl alcohol), a poly(vinyl pyrrolidone), poly(vinyl imidazole), or polyester in an amount of up to and including 20 weight % based on the total solids content of the composition, or the total dry weight of the imageable layer.

The radiation-sensitive composition can also include a variety of other optional compounds including but not limited to, dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

In some embodiments, the radiation-sensitive composition also includes a mercaptan derivative such as a mercaptotriazole such as 3-mercapto-1,2,4-triazole, 4-methyl-3-mercapto-1,2,4-triazole, 5-mercapto-1-phenyl-1,2,4-triazole, 4-amino-3-mercapto-1,2,4-triazole, 3-mercapto-1,5-diphenyl-1,2,4-triazole, and 5-(p-aminophenyl)-3-mercapto-1,2,4-triazole. Various mercaptobenzimidazoles, mercaptobenzthiazoles, and mercaptobenzoxazoles may also be present.

Imageable Elements

The imageable elements are formed by suitable application of a radiation-sensitive composition as described above to a suitable substrate to form an imageable layer. This substrate can be treated or coated in various ways as described below prior to application of the radiation-sensitive composition. Preferably, there is only a single imageable layer comprising the radiation-sensitive composition of this invention. If the substrate has been treated to provide an "interlayer" for improved adhesion or hydrophilicity, the applied radiation-sensitive composition is generally considered the "top" or outermost layer. These interlayers, however, are not considered "imageable layers". While there may be no need to apply what is conventionally known as an overcoat (such as an oxygen impermeable topcoat) to the imageable layer(s) as described in WO 99/06890 (Pappas et al.), it can be used if desired. Such overcoat layers can comprise one or more water-soluble polymers such as poly(vinyl alcohol), poly(vinyl pyrrolidone), and poly(vinyl imidazole) and generally are present at a dry coating weight of from about 0.1 to about 4 g/m$^2$.

The substrate generally has a hydrophilic surface, or at least a surface that is more hydrophilic than the applied radiation-sensitive composition on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both flat surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A preferred substrate is composed of an aluminum support that may be treated using techniques known in the art, including physical graining, electrochemical graining, chemical graining, and anodizing. Preferably, the aluminum sheet is electrochemically anodized using phosphoric acid or sulfuric acid and conventional procedures.

An interlayer may be formed by treatment of the aluminum support with, for example, a silicate, dextrine, calcium zirconium fluoride, hexafluorosilicic acid, a phosphate solution containing sodium fluoride, poly(vinyl phosphonic acid) (PVPA), vinyl phosphonic acid copolymer, poly(acrylic acid), or acrylic acid copolymer. Preferably, the aluminum support is mechanically-grained, phosphoric acid-anodized, and treated with poly(acrylic acid) using known procedures to improve surface hydrophilicity.

The thickness of the substrate can be varied but should be sufficient to sustain the wear from printing and thin enough to wrap around a printing form. Preferred embodiments include a treated aluminum foil having a thickness of from about 100 to about 600 µm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaging cylinders is described for example in U.S. Pat. No. 5,713,287 (Gelbart).

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Preferably, the radiation-sensitive composition is applied as the outermost layer.

Illustrative of such manufacturing methods is mixing the radically polymerizable component, initiator composition, radiation absorbing compound, polymeric binder, and any other components of the radiation-sensitive composition in a suitable organic solvent [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Preferred coating solvents and representative imageable layer formulations are described in the Examples below. After proper drying, the coating weight of the imageable layer is generally from about 0.1 to about 5 g/m², preferably from about 0.5 to about 3.5 g/m², and more preferably from about 0.5 to about 2 g/m².

Layers can also be present under the imageable layer to enhance developability or to act as a thermal insulating layer. The underlying layer should be soluble or at least dispersible in the developer and preferably have a relatively low thermal conductivity coefficient.

The imageable elements have any useful form including but not limited to, printing plate precursors, printing cylinders, printing sleeves and printing tapes (including flexible printing webs). Preferably, the imageable members are printing plate precursors that can be of any useful size and shape (for example, square or rectangular) having the requisite imageable layer disposed on a suitable substrate. Printing cylinders and sleeves are known as rotary printing members having the substrate and imageable layer in a cylindrical form. Hollow or solid metal cores can be used as substrates for printing sleeves.

Imaging Conditions

During use, the imageable element is exposed to a suitable laser providing "violet", near-infrared, or infrared radiation, depending upon the radiation absorbing compound present in the radiation-sensitive composition, at a wavelength of from about 250 to about 1500 nm. Preferably, imaging is carried out using an infrared laser providing imaging radiation at a $\lambda_{max}$ of from about 650 to about 1400 nm. The laser used to expose the imageable element is preferably a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1060 to about 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful imaging apparatus is available as models of Creo Trendsetter® imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio). "Violet" imaging can be carried out using such equipment as a Fuji Luxel Vx-9600 platesetter.

Generally, infrared imaging can be carried out generally at an imaging (exposure) energy of at least 20 mJ/cm and up to and including 500 mJ/cm², preferably at from about 50 to about 300 mJ/cm².

Imaging radiation in the "violet" region of the spectrum, and particularly at a wavelength of at least 250 nm and up to and including 450 nm, can be carried out generally using energies of at least 0.01 mJ/cm² and up to and including 0.5 mJ/cm², and preferably at least 0.02 and up to and including about 0.1 mJ/cm². It would be desirable, for example, to image the "violet"—sensitive imageable elements at a power density in the range of at least 0.5 and up to and including 50 kW/cm² and preferably of at least 5 and up to and including 30 kW/cm².

Development and Printing

Without the need for a pre-heat step after imaging, the imaged elements can be developed "off-press" using an organic solvent-based developer as described herein.

Alternatively, the imaged element can be treated overall with heat before such development. Such heat treatment can be carried out at a temperature of from about 85 to about 135° C. for a time of from about 20 to about 100 seconds.

More particularly, the developers useful in this invention are organic solvent-based developers that are generally single-phase solutions including one or more organic solvents. Particularly useful organic solvents include but are not limited to, benzyl alcohol, reaction products of phenol with ethylene oxide (phenol ethoxylates) or propylene oxide (phenol propoxylates), such as ethylene glycol phenyl ether (2-phenoxyethanol) and 2-phenoxyethanol, (b) esters and ethers of alkylene glycols having 6 or less carbon atoms such as ethylene glycol, propylene glycol, diethylene glycol, 2-ethoxyethanol, 2(-2-ethoxy)ethoxyethanol, and 2-butoxyethanol. Preferably, benzyl alcohol is the only organic solvent present in the developer.

The noted organic solvents are present in the developer in an amount of from about 0.5 to about 15 weight % (based on total developer weight), but preferably the developer comprises benzyl alcohol in an amount of at least 2% solids and up to and including 10% solids (based on total developer weight), and more preferably from about 3 to about 5 weight %.

In general, these developers have a pH of less than 12, and generally a pH of at least 6. Preferably, the pH is 10 or less and more preferably it is from about 6.5 to about 9.5.

Preferably, the developers are free of silicates and hydroxides, meaning that these components are not purposely added, and if they are present inadvertently, they are present in an amount of less than 0.25 weight % (based on total developer weight). By "silicates" we mean alkali metal silicates having a $SiO_2$ to $M_2O$ weight ratio of at least 0.3 and up to 1.2 in which M is an alkali metal (such as lithium, sodium, potassium, or mixtures thereof). Preferably, the $SiO_2$ to $M_2O$ is from about 0.6 to about 1.1. By "hydroxides" we mean alkali metal hydroxides such as lithium hydroxide, sodium hydroxide, potassium hydroxide, and ammonium hydroxide.

In addition, it is also preferable that the developers are free of: (a) reaction products of phenol with ethylene oxide (phenol ethoxylates) or propylene oxide (phenol propoxylates), such as ethylene glycol phenyl ether (2-phenoxyethanol) and 2-phenoxyethanol, (b) esters and ethers of alkylene glycols having 6 or fewer carbon atoms such as ethylene glycol, propylene glycol, diethylene glycol, 2-ethoxyethanol, 2(-2-ethoxy)ethoxyethanol, and 2-butoxyethanol, and (c) mono- and diethanolamines such as monoethanolamine and diethanolamine. By "free", we also mean that these compounds are not purposely added to the developers and if they are inadvertently present, they are individually present in an amount of less than 0.25 weight % (based on total developer weight).

The developers comprise a) an amphoteric surfactant comprising a nitrogen-containing heterocycle, b) an amphoteric surfactant having two or more nitrogen atoms, or c) an amphoteric surfactant of a) and an amphoteric surfactant of b).

Preferably, the amphoteric surfactant is type a) and more preferably comprises two basic nitrogen atoms in the heterocyclic ring. In some embodiments, the amphoteric surfactant comprises both nitrogen atoms and carboxy groups wherein the number of nitrogen atoms is greater than the number of carboxy groups.

Most preferred amphoteric surfactants have a carboxylate (usually through a linking group) attached to a nitrogen-containing heterocycle. One such useful amphoteric surfactant is represented as follows:

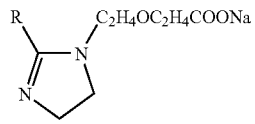

wherein R is a substituted or unsubstituted alkyl group having 1 to 20 carbon atoms and preferably from about 3 to 12 carbon atoms. Commercial examples of such amphoteric surfactants include but are not limited to, Crodateric CyNa50 (available from Croda, Edison, N.J.) that is a capryloamphoproprionate, and ALKAWET.RTM.LF (available from Lonza, Allendale, N.J.).

The amphoteric surfactant can be present in an amount of at least 2 weight % (preferably at least 4 weight %), and up to 10 weight %, in the developer (based on total developer weight).

The developer used in this invention can further comprise a benzene or naphthalene sulfonate surfactant (or both) in an amount of at least 5 weight % (preferably at least 6.5 weight % solids and up to 15 weight %). Commercial examples (or sources) of such surfactants include but are not limited to, Naxonate® 4L and Naxonate® 4ST (from Nease Corporation, Blue Ash, Ohio) containing benzene sulfonates and Naxan® ABL (from Nease Corporation), Geowet WL (from GEO Specialty Chemicals, Lafayette, Ind.), and Petro AA (from Monson Corporation, Leominster, Mass.) for naphthalene sulfonates.

It is desirable that the weight ratio of all of the surfactants (total of amphoteric and benzene or naphthalene sulfonate surfactants) to organic solvent(s) such as benzyl alcohol, in the developer be at least 2.5:1 and preferably at least 3:1.

Representative solvent-based developers useful in the practice of this invention include but are not limited to 955 Developer (available from Eastman Kodak Company).

Generally, the developer is applied to the imaged element by rubbing or wiping the outer layer of the imaged element with an applicator containing the developer. Alternatively, the imaged element can be brushed with the developer or the developer may be applied by spraying the outer layer with sufficient force to remove the exposed regions. Still again, the imaged element can be immersed in the developer.

Following this development, the imaged element can be rinsed with water and dried in a suitable fashion. The dried element can also be treated with a conventional gumming solution [such as a poly(vinyl alcohol), poly(methacrylic acid), poly(methacrylamide), poly(hydroxyethyl methacrylate), poly(vinyl methylether), a gelatin, a polysaccharide, a cellulose, and preferably gum arabic]. In addition, a post-bake operation can be carried out, with or without a blanket exposure to UV or visible radiation. Alternatively, a post-UV floodwise exposure (without heat) can be used to enhance the performance of the imaged element. Blanket (floodwise or overall) UV exposure can be carried out using a suitable source of UV radiation such as a Spectramatch™ L1250 diazo/photopolymer lamp such as that available from OLEC Corporation (Irvine, Calif.).

Printing can be carried out by applying a lithographic ink and fountain solution to the printing surface of the imaged and developed element. The fountain solution is taken up by the non-exposed (non-imaged) regions, that is, the surface of the hydrophilic substrate revealed by the development, and the ink is taken up by the exposed (imaged or non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

The following examples are provided to illustrate the practice of the invention but are by no means intended to limit the invention in any manner.

EXAMPLES

The components and materials used in the examples and analytical methods used in evaluation were as follows. Unless otherwise noted, the chemicals can be obtained from commercial sources such as Aldrich Chemical Co. (Milwaukee, Wis.):

BLO represents γ-butyrolactone.

Byk® 307 is a polyethoxylated dimethyl polysiloxane copolymer that is available from Byk Chemie (Wallingford, Conn.) in a 25 wt. % xylene/methoxypropyl acetate solution.

Copolymer 2 is a 43/24/24/9 weight percent copolymer of acrylonitrile, methyl methacrylate, vinyl carbazole, and methacrylic acid.

Graft Copolymer 1 is a 10/60/20/10 weight percent copolymer of poly(ethylene glycol) methyl ether methacrylate ($M_n$~1,100), acrylonitrile, styrene, and methacrylic acid, having an acid number of 65.

Graft Copolymer 3 is a 10/55/25/10 weight percent copolymer of poly(ethylene glycol) methyl ether methacrylate ($M_n$~1,100), acrylonitrile, vinyl carbazole, and methacrylic acid, having an acid number of 65.

HB-NK Ester BPE 500 is an ethoxylated Bisphenol A dimethacrylate available from NK-Esters (Japan).

IR Dye 1 (also known as IRT dye) was obtained from Showa Denko (Japan) and is represented by the following formula:

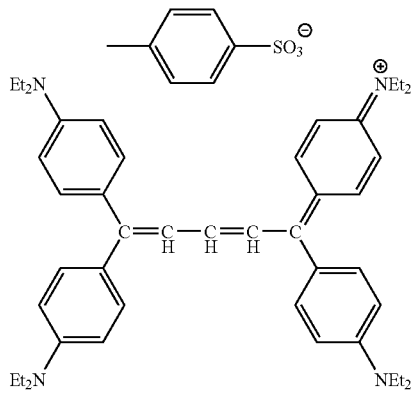

IR Dye 1.

Initiator A is bis(4-t-butylphenyl) iodonium tetraphenylborate.

Irganox® 1035 is thiodiethylene bis(3,5-di-tert-butyl-4-hydroxyhydrocinnamate) and was obtained from Ciba Specialty Chemicals Company.

Kayamer PM-2 is a mixed phosphate of 2-hydroxyethyl methacrylate that is available from Nippon Kayaku (Japan).

MEK represents methyl ethyl ketone.

Oligomer 1 is a 30% by weight solution in ethyl acetate of a urethane acrylate prepared by reacting 2 parts of hexamethylene diisocyanate, 2 parts of hydroxyethyl methacrylate and 1 part of 2-(2-hydroxyethyl)piperidine.

Oligomer A is a urethane acrylate that was prepared by reacting Desmodur N 100 with hydroxyethyl acrylate and pentaerythritol triacrylate (80% by weight in MEK).

PEGDA is a polyethylene glycol diacrylate (MW=700).

PGME represents 1-methoxy-2-propanol that is also known as Dowanol PM.

Phosmer PE is an ethylene glycol methacrylate phosphate with 4-5 ethylene glycol units that was obtained from Uni-Chemical Co., Ltd. (Japan).

Pigment A (951) is a 27% solids dispersion of 7.7 parts of a polyvinyl acetal derived from poly(vinyl alcohol) acetalized with acetaldehyde, butyraldehyde, and 4-formylbenzoic acid, 76.9 parts of Irgalith Blue GLVO (Cu-phthalocyanine C.I. Pigment Blue 15:4), and 15.4 parts of Disperbyk® 167 dispersant (Byk Chemie) in 1-methoxy-2-propanol.

SR-349 is an ethoxylated Bisphenol A diacrylate that was obtained from Sartomer Company, Inc. (Exton, Pa.).

SR-399 is dipentaerythritol pentaacrylate that was obtained from Sartomer Company, Inc. (Exton, Pa.).

955 Developer is a solvent based developer that is available from Eastman Kodak Company (Rochester, N.Y.).

Preparation of Polymer a:

AIBN [2,2'-azobis(iso-butyronitrile), Vazo-64, 1.6 g], methyl methacrylate (20 g), acrylonitrile (24 g), N-vinyl carbazole (18 g, from Polymer Dajac), methacrylic acid (18 g), and N,N'-dimethylacetamide (DMAC, 320 g) were placed in a 1000-ml 3-necked flask, equipped with magnetic stirring, condenser, temperature controller, and $N_2$ inlet. The reaction mixture was heated to 60° C. and stirred under $N_2$ protection overnight (about 16 hours). The % N.V. was measured with about 20%.

To above reaction mixture (after nitrogen protection was removed), potassium hydroxide (5.2 g) in water (40 g) was slowly added and a viscous liquid was formed. After stirring the mixture for 10 minutes, allyl bromide (13.3 g) was added and the mixture was stirred at 55° C. for 3 hours. Concentrated (36%) hydrochloric acid (12 g) in DMAC (40 g) was added to the flask and the reaction mixture was stirred for another 3 hours. The resulting reaction mixture was then slowly dropped into a mixture of 12 liters of ice water with 20 g of concentrated hydrochloric acid while stirring. The resulting precipitate was filtered and washed with 2000 ml of n-propanol, followed by washing with 2000 ml of water. A fine white powder was obtained after filtration. The powder was dried at room temperature overnight and then at 50° C. for 5 hours to obtain 63 g of polymer solid.

Preparation of Polymer B:

AIBN [2,2'-azobis(iso-butyronitrile), Vazo-64, 1.6 g], methyl methacrylate (20 g), acrylonitrile (28 g), N-vinyl carbazole (14 g), methacrylic acid (18 g), and N,N'-dimethylacetamide (DMAC, 320 g) were placed in a 1000-ml 3-necked flask, equipped with magnetic stirring, condenser, temperature controller, and $N_2$ inlet. The reaction mixture was heated to 60° C. and stirred under $N_2$ protection overnight (about 16 hours). The % N.V. was measured with about 20%.

To above reaction mixture (after nitrogen protection was removed), potassium hydroxide (5.2 g) in water (40 g) was slowly added and a viscous liquid was formed. After stirring the mixture for 10 minutes, allyl bromide (13.3 g) was added and the mixture was stirred at 55° C. for 3 hours. Concentrated (36%) hydrochloric acid (12 g) in DMAC (40 g) was added to the flask and the reaction mixture was stirred for another 3 hours. The resulting reaction mixture was then slowly dropped into a mixture of 12 liters of ice water with 20 g of concentrated hydrochloric acid while stirring. The resulting precipitate was filtered and washed with 2000 ml of n-propanol, followed by washing with 2000 ml of water. A fine white powder was obtained after filtration. The powder was dried at room temperature overnight and then at 40° C. for 5 hours to obtain 60 g of polymer solid.

Preparation of Polymer C:

AIBN [2,2'-azobis(iso-butyronitrile), Vazo-64, 1.6 g], methyl methacrylate (10 g), acrylonitrile (24 g), N-vinyl carbazole (20 g, from Polymer Dajac), methacrylic acid (26 g), and N,N'-dimethylacetamide (DMAC, 320 g) were placed in a 1000-ml 3-necked flask, equipped with magnetic stirring, condenser, temperature controller, and $N_2$ inlet. The reaction mixture was heated to 60° C. and stirred under $N_2$ protection overnight (about 16 hours). The % N.V. was measured with about 20%.

To above reaction mixture (after nitrogen protection was removed), potassium hydroxide (12.7 g) in water (40 g) was slowly added and a viscous liquid was formed. After stirring the mixture for 10 minutes, allyl bromide (27.5 g) was added and the mixture was stirred at 55° C. for 3 hours. Concentrated (36%) hydrochloric acid (25 g) in DMAC (40 g) was added to the flask and the reaction mixture was stirred for another 3 hours. The resulting reaction mixture was then slowly dropped into a mixture of 12 liters of ice water with 20 g of concentrated hydrochloric acid while stirring. The resulting precipitate was filtered and washed with 2000 ml of n-propanol, followed by washing with 2000 ml of water. A fine white powder was obtained after filtration. The powder was dried at room temperature overnight and then at 50° C. for 5 hours to obtain 66 g of polymer solid.

Example 1

An imageable layer formulation was prepared by dissolving Polymer A (1.2 g), Oligomer A (0.83 g), IR Dye 1 (0.094 g), Irganox® 1035 (0.50 g, 5% in MEK), SR-399 (1.28 g), Pigment 951 (0.34 g), PEGDA (0.28 g), Phosmer PE (0.038 g), Byk® 307 (0.32 g), and Initiator A (0.22 g) in PGME (29.9 g) and MEK (15.0 g). An electrochemically-grained and sulfuric acid-anodized aluminum substrate that had been post-treated with poly(vinyl phosphoric acid) was coated with the formulation at a dry coating weight of about 1.3 g/m$^2$ when properly dried at 77° C. for about 2 minutes on a rotating drum.

The resulting imageable element was placed on a CREO® Trendsetter 3244x image setter (Creo, a subsidiary of Eastman Kodak Company, Burnaby, British Columbia, Canada) and exposed to an 830 nm IR laser at 4.5 W power and varying drum speed (250-60 RPM). The imaged element was then developed in a tray using 955 Developer at 25° C. The minimum energy to achieve a stable solid density image and clean background was about 120 mJ/cm$^2$. After the resulting printing plate was incubated at either 48° C. or 38° C./80% humidity for 5 days, it showed similar digital speed and clean background.

Example 2

An imageable layer formulation was prepared by dissolving Polymer B (1.2 g), Oligomer A (0.83 g), IR Dye 1 (0.094 g), Irganox® 1035 (0.50 g, 5% in MEK), SR-399 (1.28 g), Pigment 951 (0.34 g), PEGDA (0.28 g), Phosmer PE (0.038 g), Byk® 307 (0.32 g), and Initiator A (0.22 g) in PGME (29.9 g) and MEK (15.0 g). An electrochemically-grained and sulfuric acid-anodized aluminum substrate that had been post-treated with poly(vinyl phosphoric acid) was coated with the formulation at a dry coating weight of about 1.3 g/m2 when properly dried at 77° C. for about 2 minutes on a rotating drum.

The resulting imageable element was imaged and processed as described in Example 1. The minimum energy to achieve a stable solid density image and clean background was about 130 mJ/cm$^2$. After the resulting printing plate was incubated at either 48° C. or 38° C./80% humidity for 5 days, it showed similar digital speed and clean background.

Example 3

An imageable layer formulation was prepared and coated as described in Example 1 on an electrochemically-grained and sulfuric acid-anodized aluminum substrate that had been post-treated with poly(vinyl phosphoric acid) was coated with the formulation at a dry coating weight of about 1.3 g/m$^2$ when properly dried at 77° C. for about 2 minutes on a rotating drum.

On the imageable layer was coated a topcoat formulation comprising Airvol 203 poly(vinyl alcohol) (67.9 g of 9.7% aqueous solution), poly(vinyl imidazole) (5.8 g of 20% aqueous solution), 2-propanol (20.7 g), and water (405.6 g). After applying the topcoat formulation in a similar manner as the imageable layer formulation, the imageable element was dried at 77° C. for about 2 minutes on a rotating drum to provide a dry topcoat coating of about 0.35 g/m2

The resulting imageable element was imaged and processed as described in Example 1 (except 2.5 W in the imaging). The minimum energy to achieve a stable solid density image and clean background was about 60 mJ/cm$^2$. After the resulting printing plate was incubated at 48° C. for 5 days, it showed similar digital speed and clean background.

Another element of this type was exposed at 120 mJ/cm and then mounted on a Miehle sheet-fed printing press using a wear ink containing 1.5% calcium carbonate to produce at least 15,000 good impressions.

Example 4

An imageable layer formulation was prepared and coated as described in Example 2 on an electrochemically-grained and sulfuric acid-anodized aluminum substrate that had been post-treated with poly(vinyl phosphoric acid) was coated with the formulation at a dry coating weight of about 1.3 g/m$^2$ when properly dried at 77° C. for about 2 minutes on a rotating drum.

On the imageable layer was coated a topcoat formulation comprising Airvol 203 poly(vinyl alcohol) (67.9 g of 9.7% aqueous solution), poly(vinyl imidazole) (5.8 g of 20% aqueous solution), 2-propanol (20.7 g), and water (405.6 g). After applying the topcoat formulation in a similar manner as the imageable layer formulation, the imageable element was dried at 77° C. for about 2 minutes on a rotating drum to provide a dry topcoat coverage of about 0.35 g/m$^2$.

The resulting imageable element was imaged and processed as described in Example 3. The minimum energy to achieve a stable solid density image and clean background was about 60 mJ/cm$^2$. After the resulting printing plate was incubated at 48° C. for 5 days, it showed similar digital speed and clean background.

Another element of this type was exposed at 120 mJ/cm$^2$ and then mounted on a Miehle sheet-fed printing press using a wear ink containing 1.5% calcium carbonate to produce at least 15,000 good impressions.

Example 5

A sub-coating formulation of 14.2% Colloid 140 (available from Kemira Chemicals, Kennesaw, Ga.), 4.3% phosphoric acid, and 1.3% Surfactant 10G (available from Arch Chemicals, Norwalk, Conn.) in water was applied to a brush-grained, phosphoric acid-anodized aluminum metal sheet and dried to a final coating weight of 0.03 g/m$^2$. An imageable layer formulation prepared as described in TABLE I below was then applied to the sub-coated substrate and was dried to provide an imageable layer with a coating coverage of 1.6 g/m$^2$. The dried imageable layer was then coated with a solution consisting of 5.64% poly(vinyl alcohol) (88% hydrolyzed), 0.3% poly(vinyl pyrrolidone), 3.76% isopropanol, and 90.3% water and dried to a coating coverage of 1.9 g/m2. The resulting imageable element was imaged on a Fuji Luxel Vx-9600 platesetter at an exposure dose of 30 µJ/cm$^2$ and processed with Kodak Polychrome Graphics 955 negative plate developer. The resulting printing plate was used to print 40,000 impressions on a Komori Sprint 26 press with abrasive ink before solid images began to show wear.

Example 6

An imageable layer formulation was prepared as described in TABLE I below and applied to electrochemically grained, sulfuric acid-anodized aluminum that had been post-treated with a monosodium phosphate solution containing sodium fluoride. The coating was dried to provide a coverage of 1.6 g/m$^2$. The imageable layer was then coated with a solution consisting of 5.64% poly(vinyl alcohol) (88% hydrolyzed), 0.3% poly(vinyl pyrrolidone), 3.76% isopropanol, and 90.3% water and dried to a coating coverage of 1.9 g/m². The resulting imageable element was imaged on a Fuji Luxel Vx-9600 platesetter at an exposure dose of 44 µJ/cm² and processed with Kodak Polychrome Graphics 955 negative plate developer. The resulting printing plate was used to print 13,000 impressions on a Miehle press with abrasive ink before solid images began to show wear.

Example 7

An imageable layer formulation was prepared as described in TABLE I below and applied to electrochemically grained, sulfuric acid-anodized aluminum that had been post-treated with a monosodium phosphate solution containing sodium fluoride. The imageable layer was dried to provide a coverage of 1.6 g/m². The imageable layer was then coated with a solution consisting of 5.64% poly(vinyl alcohol) (88% hydrolyzed), 0.3% poly(vinyl pyrrolidone), 3.76% isopropanol, and 90.3% water and dried to a coverage of 1.9 g/m². The resulting imageable element was imaged on a Fuji Luxel Vx-9600 platesetter at an exposure dose of 22 µJ/cm² and processed with Kodak Polychrome Graphics 955 negative plate developer. The resulting printing plate was used to print 35,000 impressions on a Komori Sprint 26 press with abrasive ink before solid images began to show wear. There was no change in the printed area of 50% tints from the 200$^{th}$ sheet to the last sheet of the press test.

TABLE I

| Component | Example 5 | Example 6 | Example 7 |
|---|---|---|---|
| Graft Copolymer 1 | 2.21 | 0 | 0 |
| Copolymer 2 | 0 | 2.05 | 0 |
| Graft Copolymer 3 | 0 | 0 | 2.05 |
| HB-NK Ester BPE 500 | 0.33 | 0.41 | 0 |
| SR-349 | 0 | 0 | 1.34 |
| Oligomer 1 | 6.10 | 7.53 | 4.46 |
| Kayamer PM-2 | 0.04 | 0 | 0 |
| Phosmer PE | 0 | 0.07 | 0.07 |
| 2-Phenyl-5-(4-diethylaminophenyl)-4-(2-chlorophenyl)oxazole | 0.85 | 0.93 | 0.93 |
| 2,2'-Bis(2-chlorophenyl)-4,4',5,5'-tetraphenylbiimidazole | 0.21 | 0.23 | 0.23 |
| 3-Mercapto-1,2,4-triazole | 0.38 | 0.41 | 0.41 |
| Pigment A (951) | 0.86 | 0.93 | 0.93 |
| Byk ® 307 | 0.01 | 0.01 | 0.01 |
| 1-Methoxy-2-propanol | 65.11 | 46.20 | 46.19 |
| 2-Butanone | 20.66 | 20.54 | 20.54 |
| Ethyl acetate | 3.24 | 2.20 | 4.35 |
| Dimethylacetamide | 0 | 18.49 | 18.49 |

Example 8

Four Kodak Violet Printing Plates (available from Eastman Kodak Company) were imaged on a Fuji Luxel Vx-9600 platesetter at an exposure dose of 31 µJ/cm² and then heated to a temperature of about 110° C. Imaged Plate 1 was processed with Kodak Violet 500 developer, imaged Plate 2 was processed with Kodak Polychrome Graphics 955 negative plate developer, imaged Plate 3 was processed with Kodak Polychrome Graphics 980 developer, and image Plate 4 was processed with Kodak Polychrome Graphics 2-in-1 developer. Each printing plate was used to print 15,000 impressions on a Miehle press with abrasive ink and the printed areas of 50% tints were measured on the 500$^{th}$ and on the last printed impressions. The results are shown below in TABLE II. The imaging and development of Plates 1, 3, and 4 is outside the present invention. The Relative dot sharpening data percentages were obtained by subtracting the "area % after 15,000 prints" from the "area % after 500 prints", and dividing that result by the "area % after 500 prints".

TABLE II

|  | Plate 1 | Plate 2 | Plate 3 | Plate 4 |
|---|---|---|---|---|
| Area % after 500 prints | 75.5 | 71.5 | 70 | 70 |
| Area % after 15000 prints | 72.5 | 66 | 65.5 | 56 |
| Relative dot sharpening | 4% | 8% | 6% | 20% |

These results show that practice of the present invention (development of Plate 2) provided acceptable printing results compared to the use of more toxic and corrosive negative-working developers (development of Plates 1 and 3), and the results with Plate 4 were undesirable.

Example 9

An imageable layer formulation was prepared by dissolving Polymer C (1.2 g), Oligomer A (0.83 g), IR Dye 1 (0.094 g), Irganox® 1035 (0.50 g, 5% in MEK), SR-399 (1.28 g), Pigment 951 (0.34 g), PEGDA (0.28 g), Phosmer PE (0.048 g), Byk® 307 (0.32 g), and Initiator A (0.22 g) in PGME (29.9 g) and MEK (15.0 g). An electrochemically-grained and sulfuric acid-anodized aluminum substrate that had been post-treated with poly(vinyl phosphoric acid) was coated with the formulation at a dry coating weight of about 1.3 g/m² when properly dried at 77° C. for about 2 minutes on a rotating drum.

The resulting imageable element was placed on a CREO® Trendsetter 3244x image setter (Creo, a subsidiary of Eastman Kodak Company, Burnaby, British Columbia, Canada) and exposed to an 830 nm IR laser at 4.5 W power and varying drum speed (250-60 RPM). The imaged element was then developed in a tray using 955 Developer at 25° C. The minimum energy to achieve a stable solid density image and clean background was about 70 mJ/cm². After the resulting printing plate was incubated at 48° C. for 5 days, it showed similar digital speed and clean background. Another element of this type was exposed at 120 mJ/cm² and then mounted on a Miehle sheet-fed printing press using a wear ink containing 1.5% calcium carbonate to produce at least 20,000 good impressions.

The invention has been described in detail with particular reference to certain preferred embodiments thereof, but it will be understood that variations and modifications can be effected within the spirit and scope of the invention.

The invention claimed is:
1. A method of providing an imaged and developed element comprising:
   A) using a laser, imagewise exposing a negative-working imageable element comprising a substrate having thereon an imageable layer to provide exposed and non-exposed regions, said imageable layer comprising:
   a free radically polymerizable component,
   an initiator composition capable of generating radicals sufficient to initiate polymerization of said radically polymerizable component upon exposure to imaging radiation,
   a radiation absorbing compound, and
   an aqueous solution soluble polymeric binder, and

B) contacting said imagewise exposed element with a single-phase developer to remove only said non-exposed regions to provide a developed element, wherein said developer has a pH from about 6 to about 10 and comprises:

a) an amphoteric surfactant comprising a nitrogen-containing heterocycle, b) an amphoteric surfactant having two or more nitrogen atoms, or c) an amphoteric surfactant of a) and an amphoteric surfactant of b), wherein said imagewise exposing is carried out using imaging radiation from a laser having, a $\lambda_{max}$ of from about 650 to about 1400 nm, and said initiator composition comprises a diaryliodonium borate compound represented by the following Structure (I):

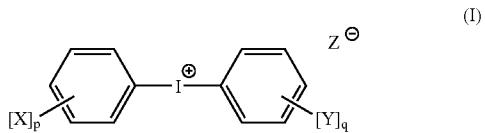

(I)

wherein X and Y are independently halo, alkyl, alkyloxy, or cycloalkyl groups or two or more adjacent X or Y groups can be combined to form a fused ring with the respective phenyl rings, p and q are independently 0 or integers of 1 to 5, provided that either p or q is at least 1 and the sum of the carbon atoms in the X and Y substituents or fused ring is at least 6, and $Z^-$ is an organic anion represented by the following Structure (II):

(II)

wherein $R_1$, $R_2$, $R_3$, and $R_4$ are independently alkyl, aryl, alkenyl, alkynyl, cycloalkyl, or heterocyclyl groups, or two or more of $R_1$, $R_2$, $R_3$, and $R_4$ can be joined together to form a heterocyclic ring with the boron atom.

2. The method of claim 1 wherein said amphoteric surfactant has a nitrogen-containing heterocycle and said developer further comprises at least 0.5 weight % of benzyl alcohol.

3. The method of claim 1 wherein said developer has a pH of at from about 6.5 to about 9.5.

4. The method of claim 1 wherein said developer is free of silicates, hydroxides, or both.

5. The method of claim 4 wherein said developer is also free of: (a) reaction products of phenol with ethylene oxide or propylene oxide, (b) esters and ethers of alkylene glycols having 6 or fewer carbon atoms, and (c) mono- and diethanolamines.

6. The method of claim 1 wherein said developer further comprises a benzene or naphthalene sulfonate surfactant in an amount of at least 5 weight %.

7. The method of claim 1 wherein said amphoteric surfactant of a) comprises two basic nitrogen atoms in a heterocyclic ring and is present in said developer in an amount of at least 2 weight %.

8. The method of claim 1 wherein said amphoteric surfactant comprises both carboxy groups and nitrogen atoms wherein the number of nitrogen atoms is greater than the number of carboxy groups.

9. The method of claim 1 wherein said developer has a pH of from about 6.5 to about 9.5, said amphoteric surfactant is present in an amount of at from about 2 to about 10 weight %, said developer further comprises benzyl alcohol in an amount of from about 0.5 to about 15 weight % and a benzene or naphthalene sulfonate surfactant in an amount of from about 5 to about 15 weight %, and the weight ratio of all of said amphoteric and benzene or naphthalene sulfonate surfactants to benzyl alcohol in said developer is at least 2.5:1.

10. The method of claim 1 wherein said amphoteric surfactant of a) has a carboxylate attached to a nitrogen-containing heterocycle.

11. The method of claim 1 wherein said imaged element can be treated overall with heat before step B.

12. The method of claim 1 wherein said imageable element further comprises an oxygen-impermeable topcoat disposed over said imageable layer.

13. The method of claim 1 further comprising using said imagewise exposed and developed element to print an impression on a receiving material.

* * * * *